(12) United States Patent
Uda et al.

(10) Patent No.: US 7,536,153 B2
(45) Date of Patent: May 19, 2009

(54) ACTIVATION SIGNAL OUTPUT CIRCUIT HAVING MULTIPLE AMPLIFIER CIRCUITS

(75) Inventors: Hisanori Uda, Nagoya (JP); Hiroaki Hayashi, Nagoya (JP); Yoshiyuki Kago, Nishio (JP); Yukiomi Tanaka, Takahama (JP); Kazuhiko Endo, Toyota (JP)

(73) Assignee: Denso Corporation, Kariya (JP)

( * ) Notice: Subject to any disclaimer, the term of this patent is extended or adjusted under 35 U.S.C. 154(b) by 476 days.

(21) Appl. No.: 10/566,614

(22) PCT Filed: Dec. 15, 2004

(86) PCT No.: PCT/JP2004/018701

§ 371 (c)(1),
(2), (4) Date: Jan. 31, 2006

(87) PCT Pub. No.: WO2005/060114

PCT Pub. Date: Jun. 30, 2005

(65) Prior Publication Data

US 2006/0217099 A1 Sep. 28, 2006

(30) Foreign Application Priority Data

Dec. 17, 2003 (JP) ............................ 2003-419014

(51) Int. Cl.
*H04B 1/16* (2006.01)

(52) U.S. Cl. ................. 455/67.13; 455/226.2; 455/334; 327/51

(58) Field of Classification Search ............. 455/253.2, 455/232.1, 280, 287, 288, 334, 337, 338, 455/341, 312, 67.13, 126, 226.2, 313; 327/50, 327/51, 52, 53, 72
See application file for complete search history.

(56) References Cited

U.S. PATENT DOCUMENTS 3,488,599 A * 1/1970 Csicsatka .................... 329/350
3,514,720 A * 5/1970 Roucache et al. ........... 332/168

(Continued)

FOREIGN PATENT DOCUMENTS

JP 57-73511 A 5/1982

(Continued)

OTHER PUBLICATIONS

Communication dated Sep. 6, 2007 in European Patent Application No. 04 807 060.1.
Supplemental Search Report dated Feb. 19, 2007 in European Application No. EP04 80 7060.

(Continued)

*Primary Examiner*—Blane J Jackson
(74) *Attorney, Agent, or Firm*—Harness, Dickey & Pierce, PLC

(57) ABSTRACT

With a capacitor C inserted in an interstage portion of multiple stages of amplifier circuits, a high pass filter is generated by the capacitor C and an input impedance |Z| of an amplifier circuit in the next stage. Accordingly, frequency components lower than a cutoff frequency fc are cut off, and therefore are not transferred to the subsequent stage. However, radio frequency components higher than or equal to a fundamental wave component determined by an envelope of a radio frequency signal intermittently transmitted can be transferred. Consequently, transfer of DC offset potentials can be cut off, and noise, such as flicker noise, having great power in a DC or near-DC zone can be effectively cut off. Thereby, the S/N ratio, detection sensitivity, and detection accuracy can be improved.

16 Claims, 7 Drawing Sheets

U.S. PATENT DOCUMENTS

| | | | |
|---|---|---|---|
| 3,684,962 A * | 8/1972 | Hottel, Jr. | 455/20 |
| 3,821,649 A * | 6/1974 | Grosjean | 455/155.1 |
| 4,127,817 A * | 11/1978 | Bell, Jr. | 455/67.12 |
| 4,140,972 A * | 2/1979 | Fletcher et al. | 455/68 |
| 4,229,735 A | 10/1980 | Houck | |
| 4,580,285 A * | 4/1986 | Richards, Jr. | 455/161.3 |
| 6,091,441 A * | 7/2000 | Al-Araji et al. | 455/3.02 |

FOREIGN PATENT DOCUMENTS

| | | | |
|---|---|---|---|
| JP | 2-080990 A | 3/1990 |
| JP | 4-291167 A | 10/1992 |
| JP | 7-321557 A | 12/1995 |
| JP | 2561023 B2 | 9/1996 |
| JP | 2605827 B2 | 2/1997 |
| JP | 10-56333 A | 2/1998 |
| JP | 10-163915 A | 6/1998 |
| JP | 2000-87609 A | 3/2000 |
| JP | 2000-354074 A | 12/2000 |
| JP | 3202624 B2 | 6/2001 |
| JP | 2001-332938 A | 11/2001 |

OTHER PUBLICATIONS

Office Action dated Aug. 8, 2008 in the corresponding Chinese Patent Application No. 2004 8003 0219.0.

* cited by examiner

ACTIVATION SIGNAL OUTPUT CIRCUIT HAVING MULTIPLE AMPLIFIER CIRCUITS

TECHNICAL FIELD

The present invention relates to an activation signal output circuit including a converter circuit that inputs intermittently transmitted radio frequency (RF) signal and outputs a detection signal.

The detection signal is defined as an output signal generated in accordance with a signal that is rectified by a detector diode and is generated in a duration in which the level (amplitude) of a waveform determined by an envelope of a waveform of a radio frequency signal is a substantially constant level or higher than or equal to a substantially constant level. As such, in an event, for example, where the radio frequency signal (RF) intermittently arrives or the presence or absence of the arrival is periodic, also the waveform of the detection signal can be periodic. From the fact that the envelope of the radio frequency signal is detected and a DC potential is output only in that duration, the detection signal can be regarded DC. However, from the fact that the detection signal varies with the envelope of the radio frequency signal, the signal can also be regarded as AC current. The DC potential of the detection signal is used herebelow as defined above.

The activation signal output circuit of the present invention is effective for use with, for example, a mobile communication device. Fields of products expected to be applied with the present invention in the future at least include those of ETCs, smart plates, LAN systems, monitor systems, and key-free systems, for example.

BACKGROUND ART

As radio frequency signal detection techniques for detection by a detector diode, the subsequent well known techniques as disclosed in Japanese Patent 2561023, Japanese Patent 2605827, Japanese Unexamined Patent Application Publication No. 4-291167, Japanese Patent 3202624, and Japanese Unexamined Patent Application Publication No. 10-56333, for example. The above conventional techniques include many devices of the type that, for example, uses multiple stages of amplifier circuits to detect a detection signal and to perform level determination. In activation signal output circuits of such a type, since signals are DC, the respective stages are configured in a direct connection pattern.

However, the circuit configuration of such a direct connection pattern of the stages causes problems when configuring, for example, a circuit that enables stable detection of a radio frequency signal of a very low level of, for example, −60 dBm. More specifically, noise generated in amplifiers in the respective stages indicates a large value in a near-DC zone, and also DC components of the noise are to the amplifiers in the subsequent stages. This becomes the cause of erroneous detection of the radio frequency signal and the cause of disabling sensitivity improvement. In addition, it is difficult to form, for example, all the transistors for constituting the amplifiers in the respective stages to have the same characteristics, such that offset in the DC potential can occur in the respective interstages. When the offset potential is transferred to the subsequent stage, also the signal levels of, for example, the detection signal and reference signal are offset, such that there can occur a case in which the transistors are saturated to thereby disable executing real detection signal amplification. Of course, such a phenomenon can be a cause of erroneous operation.

The present invention is made to solve the problems described above. Accordingly, an object of the invention is to realize an activation signal output circuit having very high sensitivity; and more particularly, a primary object of the invention is to enhance the S/N ratio and detection accuracy, for example.

DISCLOSURE OF THE INVENTION

In order to solve the problems described above, the present invention provides an activation signal output circuit that comprises multiple stages of amplifier circuits in a plurality of stages, wherein a radio frequency signal intermittently transmitted is detected to thereby generate a detection signal, and an activation signal indicative that the radio frequency signal has been detected is output in accordance with the detection signal. The activation signal output circuit is characterized in that a capacitor C is inserted in series in a signal transfer line in any one interstage portion of the amplifier circuits, whereby a high pass filter characteristic is provided.

The amplifier circuits include, for example, a type that increases the signal level and a type that compares a signal to a reference signal to thereby output the signal without amplifying the output level to a higher level. The number of the stages of the amplifier circuits is optionally determined. Normally, an amplifier circuit in the frontmost stage is a circuit that rectifies and amplifies the radio frequency signal, that is, a detector/amplifier circuit. Subsequently, through the multiple stages of amplifier circuits, an activation signal is output that enables distinguishing between events where the radio frequency signal has been received or has not been received.

According to the present invention described above, since the capacitor is inserted in series in the signal line in the interstage portion of the multiple stages of amplifier circuits, such that DC components of noise and components in a near-DC zone can be prevented from being transferred to the subsequent stage. Consequently, the detection accuracy and detection sensitivity are improved. Frequency characteristics of noise occurring in the amplifier circuit includes a 1/f characteristic, so that a high noise power occurs in a near-DC zone, and the overall noise power is almost dominated by the components in the near-DC zone. With the capacitor inserted, the noise components in the near-DC zone is cut off and is not therefore transferred to the subsequent stage. Consequently, the detection accuracy and detection sensitivity are improved.

In addition, also the offset of the DC potential of the amplifier circuit in the respective stages is cut off. Consequently, transistors in the subsequent stages are prevented from being saturated, and transfer of DC potentials of the detection signal and the reference signal are cut off, so that erroneous determination is prevented. Consequently, the detection accuracy and detection sensitivity are improved. In addition, as a prerequisite, the radio frequency signal is the intermittently transmitted signal. As such, the detection signal after having been rectified resultantly represents an envelope of the radio frequency signal, and information regarding the envelope can be transferred to the subsequent stage even when a detection waveform of the envelope is skewed. Consequently, the S/N ratio is increased to thereby make it possible to detect the radio frequency signal with high accuracy and high sensitivity.

In the invention, it is preferable that a cutoff frequency fc of the high pass filter characteristic be set lower than a frequency (=1/T) corresponding to an intermittent incoming period T of the radio frequency signal intermittently transmitted.

Thus, the cutoff frequency of the high pass filter characteristic is set in accordance with the frequency determined with the reciprocal of a repetition period (period of the envelope) T of the radio frequency signal intermittently transmitted. Accordingly, even with the capacitor inserted in the interstage portion of the amplifier circuit in the respective stages, a frequency higher or equal to the period of the envelope can be transferred to the subsequent stage. Consequently, while the detection signal for determining the presence or absence of the event of reception of the radio frequency signal is transferred to the subsequent stage, transfer of the dominant noise components is cut off. Thereby, the S/N ratio is improved, and the detection accuracy and detection sensitivity can be improved.

In addition, it is preferable that the capacitor C be set for a desired cutoff frequency fc to satisfy $2\pi fc \cdot C \cdot |Z| \approx 1$ with respect to an input impedance Z of the amplifier circuit of which an input side is connected with the capacitor C.

Thus, when the value of the capacitor C is determined for the desired cutoff frequency fc from the input impedance Z of the amplifier circuit in the subsequent stage, transfer of noise components can be securely cut off, and concurrently, the detection signal for determining the presence or absence of the event of reception of the radio frequency signal can be transferred to the subsequent stage.

The configuration may be such that a low pass filter characteristic is provided to the amplifier circuit by limiting a bias current flowing to transistors constituting the amplifier circuit to a minimized value, and a band pass filter characteristic is provided by using the low pass filter characteristic and the high pass filter characteristic provided with the capacitor.

Thereby, transfer of a high frequency signal is cut off. More specifically, since a non-linear characteristic is used for detection by the detector diode, harmonics of high order are generated in addition to a high-frequency envelope signal (fundamental wave). However, only with fundamental wave components or with fundamental wave components and low-order harmonics, it is sufficient to detect the presence or absence of the radio frequency signal being intermittently transmitted. As such, with a band pass filter configured as entirety such as to pass only the fundamental wave components or the fundamental wave components and low-order harmonics, also transfer of, for example, harmonic components and noise components is cut off, so that the detection accuracy and detection sensitivity are even more improved.

Preferably, of the amplifier circuits, an amplifier circuit in a foremost stage that detects and rectifies a radio frequency signal comprises a detector diode that detect the radio frequency signal, a differential amplifier that includes differential pair transistors TrL and TrR, and a current mirror circuit that regulate a current of the differential amplifier wherein a base current of TrL which is one of the differential pair transistors substantially matches with a direct current component of a current flowing in the detector diode; and a sum of currents flowing in the differential pair transistors TrL and TrR are regulated by the current mirror circuit to be substantially constant.

In this case, the bias current and bias voltage of the differential pair transistors of the differential amplifier are controlled with the current flowing in the detector diode, and the current is controlled by the current mirror circuit. Consequently, a very low bias current (nA level, for example) can be stably supplied to the detector diode, such that resistance to a decrease in the power source voltage is enhanced, and the detection sensitivity can be improved. In addition, since the signal is amplified by using the differential amplifier, immunity to, for example, variation and decrease in the power source voltage is enhanced, and also the detection accuracy is improved.

The configuration may be such that, of the amplifier circuits, the amplifier circuit in the foremost stage that detects and rectifies the radio frequency signal further comprises a voltage-doubler detector circuit, and the detector diode for detecting radio frequency power constitutes a part of the voltage-doubler detector circuit.

In this case, since the voltage-doubler detector circuit is incorporated in the foremost amplifier circuit that rectifies and detects the radio frequency signal of the foremost stage, the detection sensitivity is improved to thereby enable effectively improving the S/N ratio of the activation signal output circuit.

BEST MODE FOR CARRYING OUT THE INVENTION

Embodiments of the present invention will be described herebelow. However, the present invention is not limited to the individual embodiments described below.

FIRST EMBODIMENT

Figure 1:
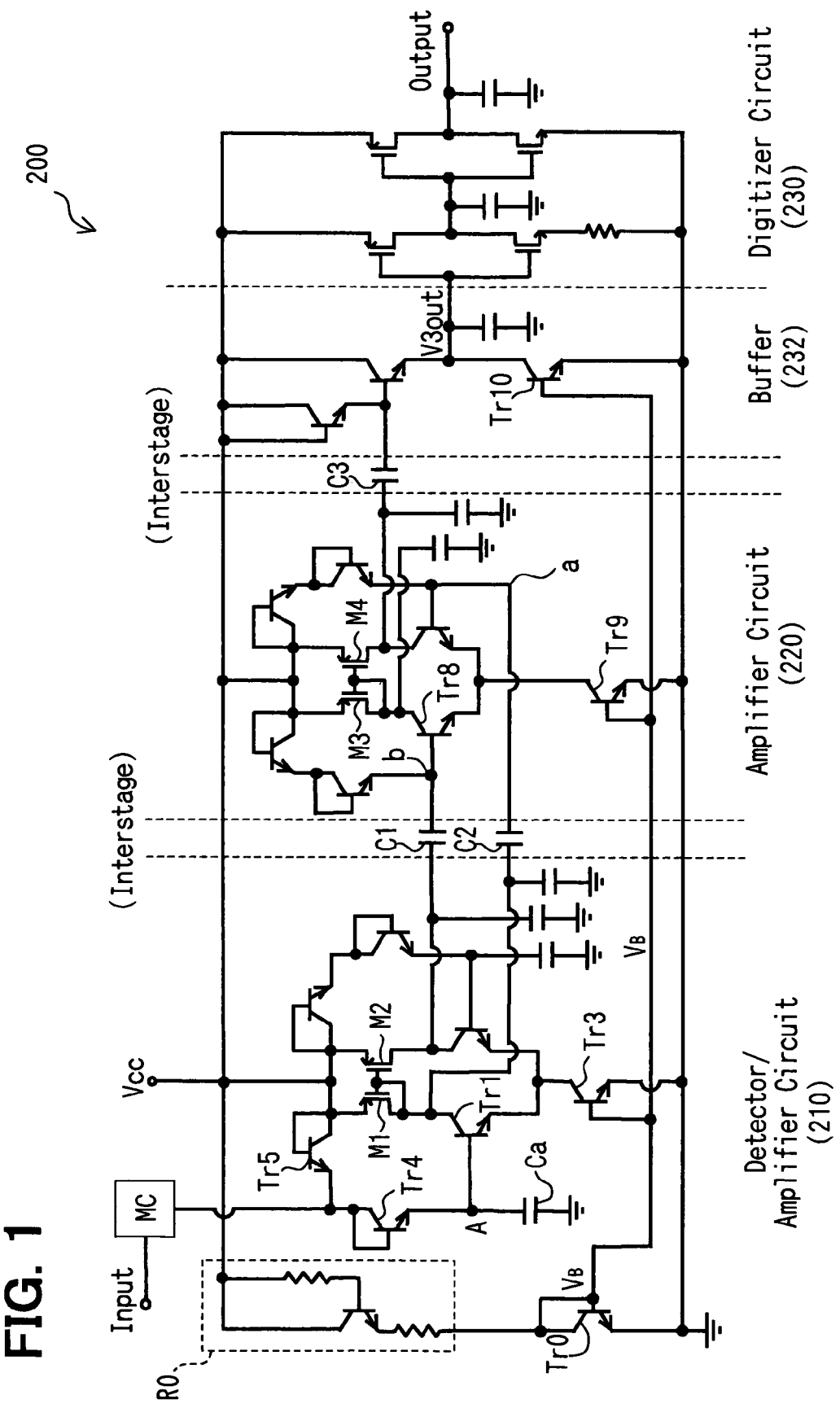
FIG. 1 is a circuit diagram of an activation signal output circuit 200 according to a first embodiment.

FIG. 1 is a circuit diagram of an activation signal output circuit 200 according to a first embodiment. First, an overall configuration of the activation signal output circuit 200 will be described herebelow in accordance with FIG. 1.

A current mirror circuit is configured of, for example, a reference transistor Tr0, a load resistor R0, and subsidiary transistors Tr3, Tr9 and Tr10. The load resistor R0 is used to optimize a collector current of the reference transistor Tr0.

The base potentials of the subsidiary transistors Tr3, Tr9 and Tr10 are the same as the base potential of the reference transistor Tr0, the currents flowing in the subsidiary transistors Tr3, Tr9 and Tr10 are regulated to the same amount of the current flowing in the reference transistor Tr0.

A diode is configured by forming a connection of a collector and a base (the connection will be referred to as "diode connection," hereafter). Accordingly, a detector diode of a detector/amplifier circuit 210 is configured of a transistor Tr4. With a transistor Tr5, a capacitor in a matching circuit MC, a capacitor Ca at a point A and resistance components of the transistors Tr1 and TR3, the transistor Tr4 forms a voltage-doubler detector circuit. That is, the transistor Tr4 provides a voltage doubler rectification operation. The transistor Tr1 corresponds to a differential pair transistor TrL of the present invention.

Capacitors C1 and C2, respectively, are inserted in series in signal transfer lines between the detector/amplifier circuit 210 having the detector diode and an amplifier circuit 220 in the next stage. The same circuit configuration as that of the circuit configuration of the detector/amplifier circuit 210 is used for the amplifier circuit 220. A capacitor C3 is similarly inserted in series in an interstage signal transfer line between the amplifier circuit 220 and a buffer 232 in the next stage. Each of the capacitance values of the respective interstage capacitors (C1, C2 and C3) is 20 pF.

A buffer 232 inserted in a forestage of a digitizer circuit 230 has a circuit configuration of a well-known buffer amplifier, and provides two operations—the operation of level shift and the function of preventing a gate of a CMOS of the digitizer circuit 230 from being unstabilized. A signal indicative of the presence or absence of the event of reception of a radio frequency signal is shaped into a square wave by the CMOS of the digitizer circuit 230, and is finally output as an activation signal.

Figure 2:
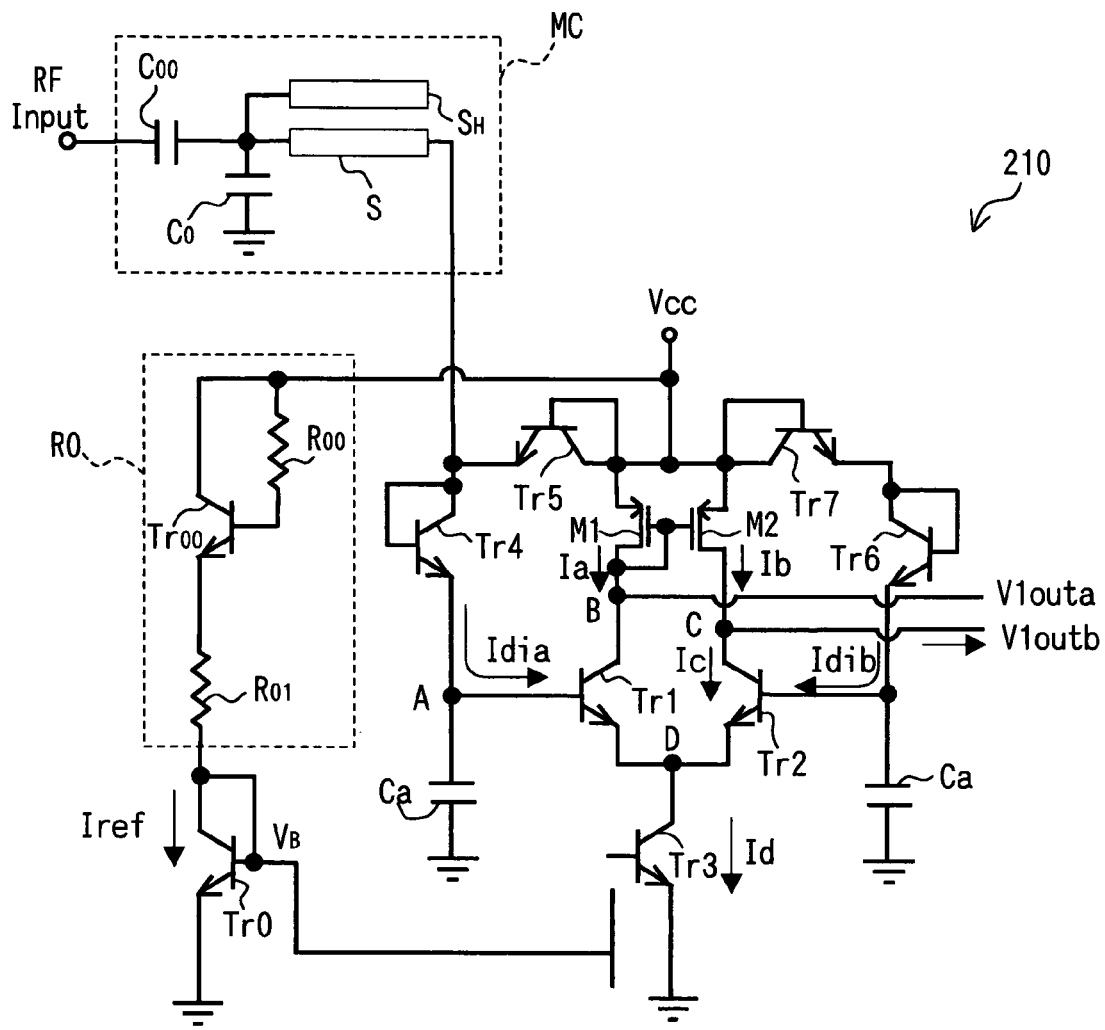
FIG. 2 is a circuit diagram of a detector/amplifier circuit 210 of the activation signal output circuit 200.

The detector/amplifier circuit 210 will be described in detail herebelow. FIG. 2 shows a circuit diagram of the detector/amplifier circuit 210 of the activation signal output circuit 200. The matching circuit MC for efficiently inputting the radio frequency signal is connected to the side of a first terminal that inputs the radio frequency signal of the detector diode (Tr4). The matching circuit MC has a well-known configuration, such that a well-known configuration other than the configuration shown may be employed. The matching circuit MC shown in FIG. 2 includes a capacitor C00 inserted in series in a transfer line of the radio frequency signal from an RF input end; a capacitor C0 having one end connected to an output end of the capacitor C00 and the other end grounded; an open-half stub SH having one end connected to the output end of the capacitor C00 and the other end not grounded; and a stub S connected to the output end of the capacitor C00 and inserted in series in the above-described transfer line, wherein the other end of the stub S functions as an output end of the matching circuit MC.

A series connection of an equivalent load resistor R0, which is formed of resistors R00 and R01 and a transistor Tr00, and the reference transistor Tr0 is disposed between a power source Vcc and ground. In addition, a series connection of the transistor TR3 and a differential amplifier formed of the transistors Tr1 and Tr2, which are loads of that transistor, are disposed between the power source Vcc and ground.

The emitter of the detector diode Tr4, which is formed of the diode connection of the transistor, is connected to the base of the transistor Tr1 (differential pair transistor TrL). The collector of the detector diode Tr4 is connected to the power source Vcc via the transistor Tr5 formed of the diode connection. Similarly, the emitter of a non-detector diode Tr6 formed of the diode connection of a transistor is connected to the base of a transistor Tr2 (differential pair transistor TrR). The collector of the non-detector diode Tr6 is connected to the power source Vcc via a transistor Tr7 formed of the diode connection. The smoothing capacitor Ca is disposed between a base terminal (point A) of the differential pair transistor (Tr1, Tr2) and the ground.

Figure 3:
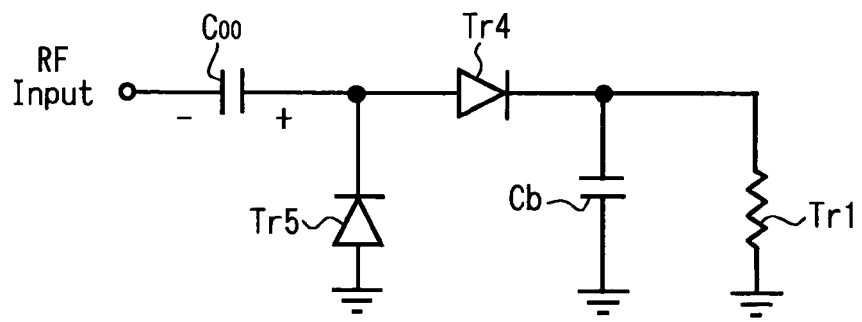
FIG. 3 is a circuit diagram showing an equivalent circuit of a voltage doubler circuit.

FIG. 3 shows an equivalent circuit of the voltage-doubler detector circuit used in the present embodiment. The voltage-doubler detector circuit is configured of the capacitor C00 of the matching circuit MC, diodes Tr4 and Tr5 formed of the transistors Tr4 and Tr5 each formed of the diode connection, a capacitor Cb, and a resistor Tr1 formed of the transistor Tr1. When the signal voltage of the input terminal is a negative half period, the diode Tr5 is energized, whereby the capacitor C00 is charged to be the polarity shown in the drawing to a maximum value Vm of the input signal. During the next positive half period of the input signal, the diode Tr5 is not energized, and the diode Tr4 (detector diode) is energized. In this event, since the voltage Vm charged to the capacitor C00 is added, a terminal voltage of the capacitor Cb is charged to about 2 Vm. Accordingly, with the voltage-doubler detector circuit being used, an S/N ratio is increased to thereby enable the reception sensitivity to further improve.

Operation of the detector/amplifier circuit 210 will be described in more detail hereafter in FIG. 2. A reference current Iref (=collector current of Tr0) and a dependent current Id (=collector current of Tr3) are guaranteed to substantially match with one another in accordance with the operation of the current mirror circuit. More specifically, since bias voltages of the transistors Tr0 and Tr3 are equal to each other, the respective amounts of current flowing in the two transistors substantially match with one another, regardless of the loads thereof. With the current Id controlled on the order of $\mu A$ by using the resistor R0, a base current Idia of the transistor Tr1, a base current Idib of the transistor Tr2, or the like becomes $Id/\beta$ with respect to a current amplification factor $\beta$ of the transistor Tr. Accordingly, since the base current of the transistor Tr, Tr2 inevitably takes a value on the order of several tens of nA, so that a low bias current can be supplied to the differential pair transistor (Tr1, Tr2). With this operation, the bias current of the detector diode Tr4 can be reduced to be very low. Consequently, power consumption is restrained; and in addition, since nonlinearity can be effectively used, the detection sensitivity for radio frequency signals can be improved. In other words, as viewed from the transistor Tr4, Tr6, the configuration is rendered equivalent to that provided with a very high load resistor obtainable through a Darlington connection between the each respective transistor and the transistor Tr1, Tr2.

With the arrangement of the circuit configuration using the above current mirror circuit, the reference current Iref of the reference transistor Tr0 and the dependent current Id normally become identical in amount to one another (Iref=Id). In particular portions, for example, devices M1 and M2 formed of two MOSFETs configure a current mirror circuit, such that a current Ia and a current Ib respectively output therefrom become identical in amount to one another. Symbol Ic in FIG. 2 denotes the collector current of the differential pair transistor Tr2 (differential pair transistor TrR).

When a radio frequency signal is input through the matching circuit MC, the radio frequency signal is double-voltage rectified by the transistor Tr4 corresponding to the detector diode, thereby increasing the potential at the point A. As a consequence, a DC current Ia flowing in the transistor Tr1 increases by $\Delta a$. In addition, the current mirror circuit is configured with the two MOSFETs (M1 and M2) that configure active loads of the differential amplifier, such that the current Ia and a current Ib on the opposite side (M2 side) increase by Δa. In this case, an equation (1) below is satisfied.

$$Ia=Ib, Iref=Id=Ia+Ic=\text{Constant} \tag{1}$$

In this event, the collector current Id of the subsidiary transistor Tr3 is normally identical in amount to the current Iref as being influenced by the operation of the above-described current mirror circuit, such that the current Id does not increase. In addition, the element M1 made of the MOSFET is formed of the diode connection, such that the potential at a point B does not vary even in the event of the radio frequency signal input. This implies that a current V1outa in the figure does not vary even in the event of the radio frequency signal input.

Accordingly, with the input of the radio frequency signal, the current Ia, Ib increases by Δa as described above, the current Ic decreases by Δa as can be known from the equation (1). Consequently, with the input of the radio frequency signal being present, V1outb in the figure increases by 2Δa. In other words, with the input of the radio frequency signal being present, the potential at a point C rises to increase V1outb by 2Δa. This is an operational principle of the detector/amplifier circuit 210.

More specifically, according to the circuit configuration described above, for example, a desired radio frequency signal can be efficiently and accurately detected in accordance with the differential value between a DC potential (cathode end potential) of the detector diode Tr4 and a DC potential (cathode end potential) of the non-detector diode Tr6. Further, according to the configuration, even when the power source potential Vcc has decreased, two bias potentials of the differential pair transistors (Tr1 and Tr2) of the differential amplifier decrease with a good balance. This makes it possible to prevent such an inconvenience event in which the sign of the differential value of the output potential ((detector-side DC)−(reference DC)) is unreasonably reversed due to the decrease of the power source potential. Consequently, the operation enables it to effectively prevent detection error attributed to drift of the power source voltage.

Figure 4:
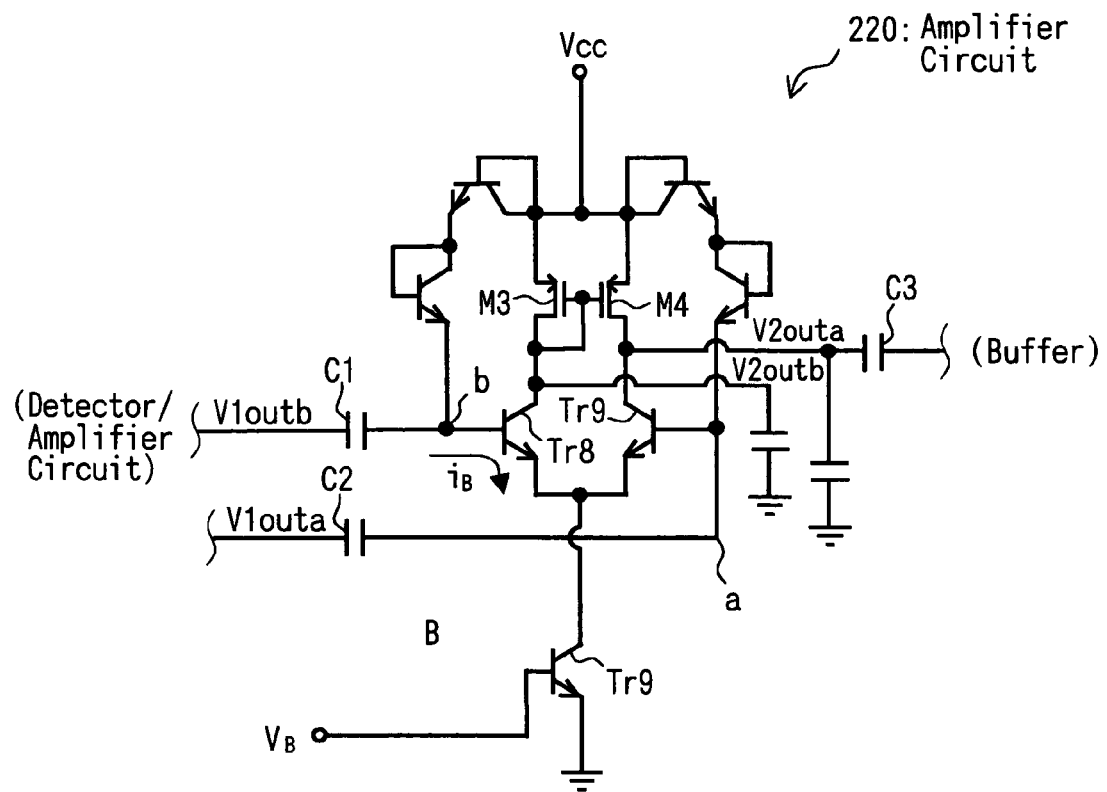
FIG. 4 is a circuit diagram of an amplifier circuit 220 of the activation signal output circuit 200.

The amplifier circuit 220 will now be described hereinbelow. FIG. 4 shows a circuit diagram of the amplifier circuit 220 of the activation signal output circuit 200. The circuit configuration has substantially the same configuration as the detector/amplifier circuit 210, and hence provides substantially the same amplifying operation as the detector/amplifier circuit 210. As such, the bias voltage at a point b that is positioned on the base terminal of the transistor Tr8 constituting one of differential pair transistors of the amplifier circuit 220 is optimized in a range of about 1.8 to about 1.9 V, similarly as the bias voltage at the point A of the transistor Tr1 of the detector/amplifier circuit 210. Consequently, the gain of the transistor Tr8 is set high, similarly as the gain of the transistor Tr1. A feature of the present invention is the provision of the capacitors C1 and C2 to the signal lines connected to the bases of the respective transistors Tr8 and Tr9.

By using a simulator, a DC current iB steadily flowing from the point b to the transistor Tr8 was calculated. As a result a current of 9.26 nA was verified. The potential at the point b at that time was 1.87 V. Accordingly, an input impedance |Z| of the amplifier circuit 220 is 201.9 MΩ.

Where the capacitance value of the interstage capacitor C1 in FIG. 4 is represented by C1, C1=20 pF as described above. In this case, according to the circuit theory, the input impedance |Z| of the amplifier circuit 220 and a cutoff frequency fc of a high pass filter formed with the capacitor C1 satisfy equation (2) below.

$$2\pi fc \cdot C1 \cdot |Z|=1, \therefore fc=39.4 \text{ [Hz]} \tag{2}$$

Figure 5A:
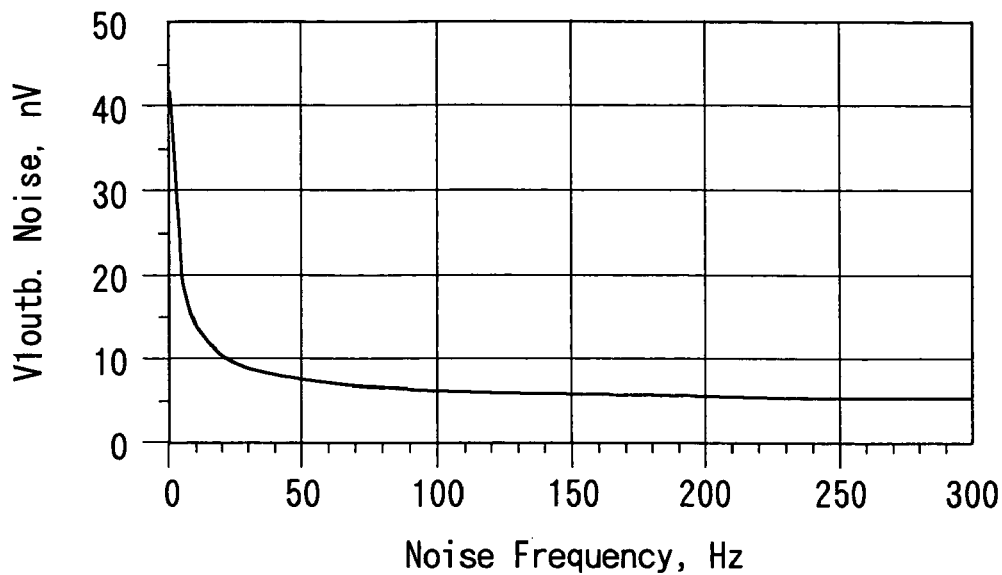
FIG. 5A is a graph showing an output signal V1outb of the amplifier circuit 210 without capacitors C1, C2, and C3 being provided.

Accordingly, the high pass filter is formed as a filter with a very narrow band for cutting off only near-DC signals. FIG. 5A shows a noise frequency analysis result of an output signal V1outb of the detector/amplifier circuit 210 without the capacitors C1 and C2 being provided. As is clear from the figure, it is understood that the noise has a DC voltage of 42 nV, and most of the noise components are 20 Hz or lower. Accordingly, with the capacitor C1, when signals of 0 to 39.4 [Hz] are cut off from the output signal V1outb, the noise components can be very effectively eliminated, so that the S/N ratio can be improved.

Figure 5B:
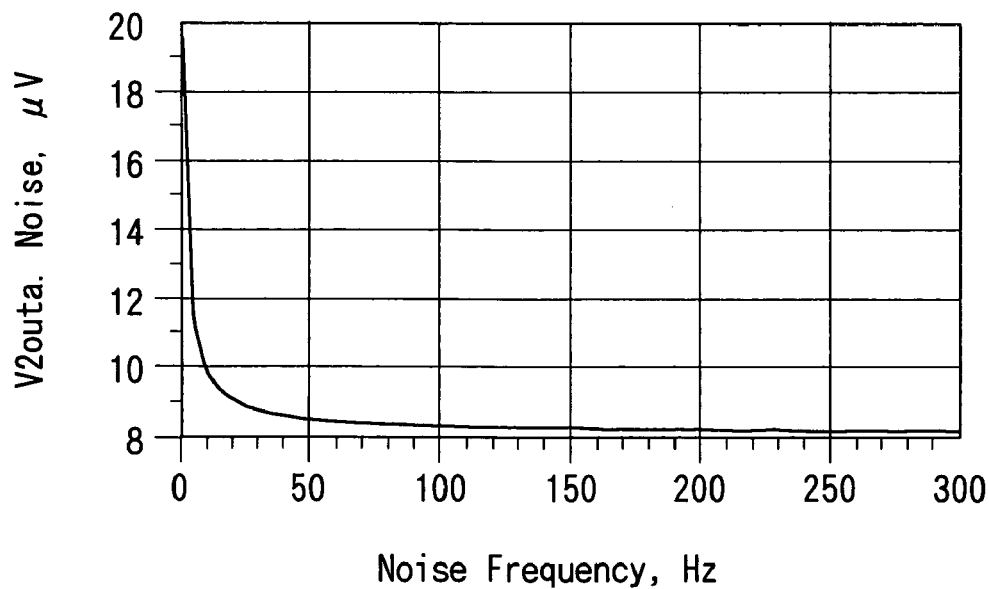
FIG. 5B is a graph showing an output signal V1outa of the amplifier circuit 220 without the capacitors C1, C2, and C3 being provided.

FIG. 5B shows a noise frequency analysis result of an output signal V2outa of the amplifier circuit 220 without the capacitors C1 and C2 being provided. As is clear from the figure, it is understood that the noise has a DC voltage of 19 μV, and most of the noise components are 20 Hz or lower. Accordingly, with the capacitor C3, when signals of 0 to 39.4 [Hz] are cut off from the output signal V2outa, the noise components can be very effectively eliminated, so that the S/N ratio can be improved.

Thus, with the capacitors provided in the interstage portions of the amplifier circuits, noise can be prevented from being transferred to the subsequent stage. Accordingly, in the amplifier circuit of the respective stages, the amplitude and the signal level, for example, can be determined in the state where the noise is reduced to be a very low level. Consequently, since error in the signal level is not transferred to the subsequent stage, the activation signal output circuit has very high detection accuracy and sensitivity.

Further, it is supposed that the relationship "fc≦fA" or "fc<fA" can be secured with respect to a frequency (fA≡1/T) corresponding to an incoming period T of the radio frequency signal. In this case, while low frequency noises such as flicker noise and DC offset are removed, a detection signal formed by rectifying the radio frequency signal can be efficiently transferred and amplified.

The operations described above were verified through simulation, and the verification will be described hereinbelow. The simulation was performed to verify the levels of S/N ratios obtainable with respect to contemplated flicker noise in the activation signal output circuit 200. The simulation was performed under the following conditions.

(1) Power Source
   (a) Power source voltage: 3.0 V(DC)
   (b) Power source current: 18 μA (2) Radio Frequency Signal
   (a) Frequency: 5.8 GHz
   (b) Power: −60 dBm
   (c) Input waveform: ASK modulated waveform
   (d) Input time: 781 μsec
   (e) Input period T: 2.343 msec
   (f) 1/T: 426.8 Hz (39.4 Hz=fc)

Figure 6A:
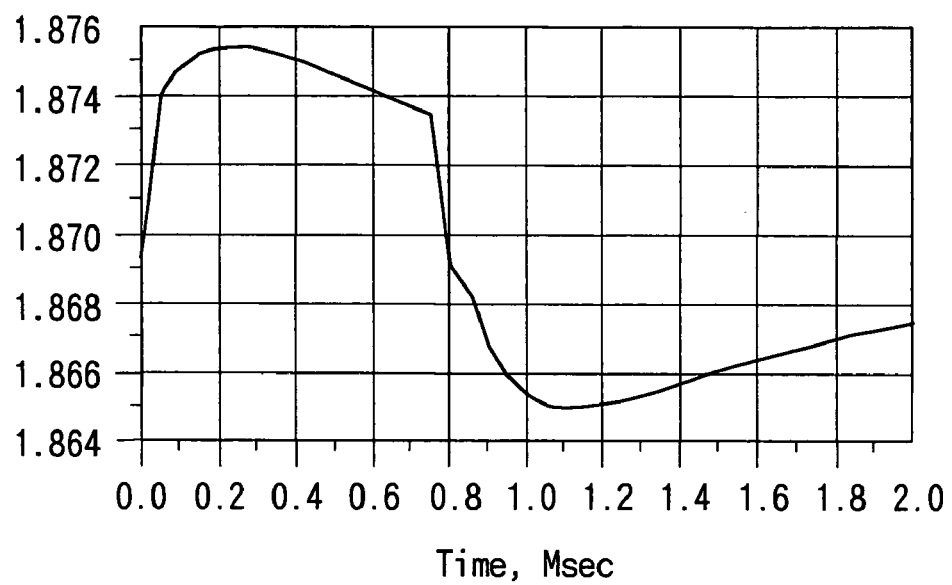
FIG. 6A is a graph showing respective inputs (potentials at point "b" and "a" in FIG. 4) of the amplifier circuit 220 in the event of reception of a radio frequency signal and in the event of non-reception immediately thereafter.
Figure 6B:
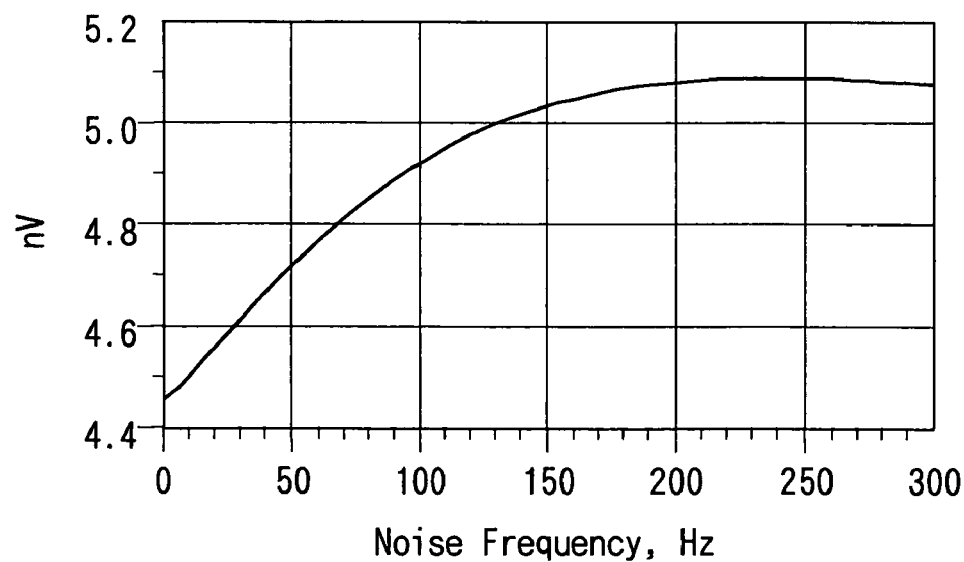
FIG. 6B is a graph showing frequency components of noise contained in respective input signals (potentials at the points "b" and "a" in FIG. 4) of the amplifier circuit 220.
Figure 7A:
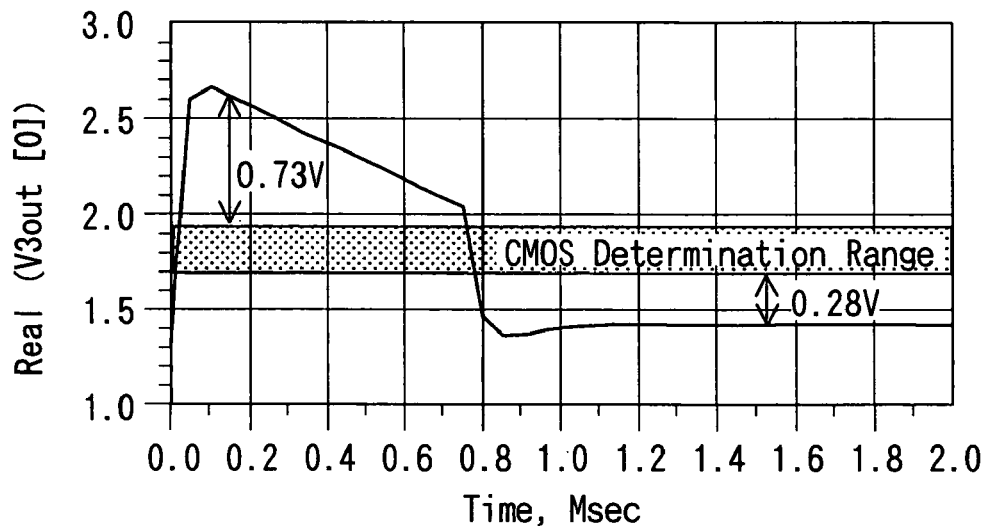
FIG. 7A is a graph showing outputs V3out of a buffer 232 at the same time as that in FIG. 6A.
Figure 7B:
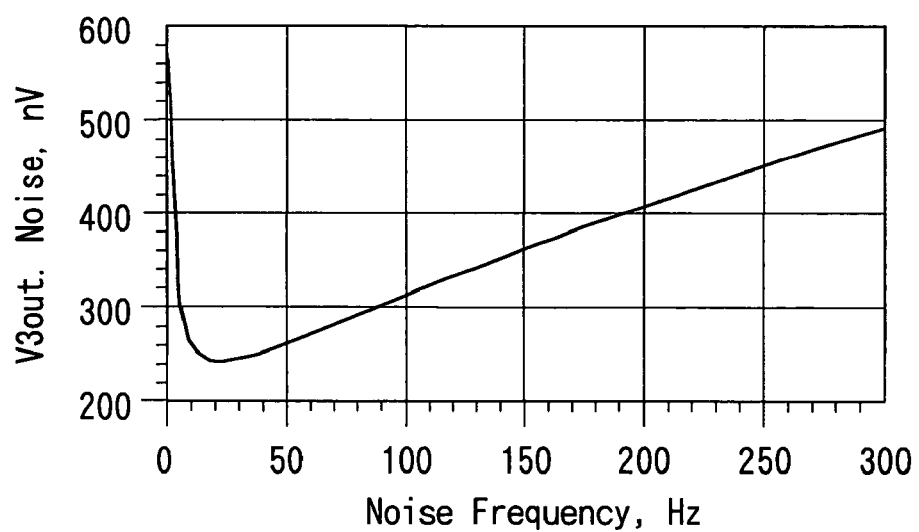
FIG. 7B is a graph (enlarged view of the vicinity of an infinitesimal point) showing frequency components of noise contained in the output V3out of the buffer 232.
Figure 7C:
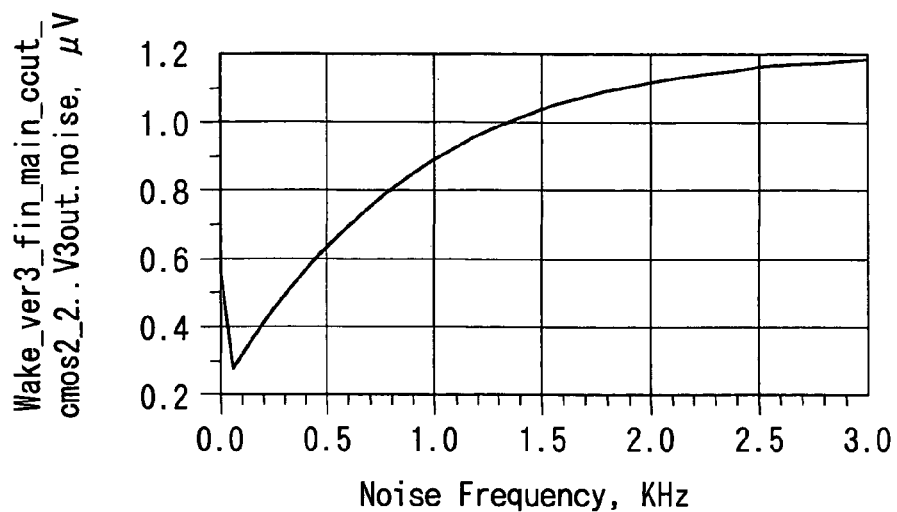
FIG. 7C is a graph showing frequency components of noise contained in the output V3out of the buffer 232.

FIG. 6A is a graph that shows respective inputs (point b in FIG. 4) after having passed through the capacitor C1; and FIG. 6B is a graph that shows noise frequency components at the potential of an input signal V1outb (point b in FIG. 4) after having passed the capacitor C1. FIG. 7A is a graph that shows an output (input of the digitizer circuit 230) V3out of the buffer 232; and FIGS. 7B and 7C are each a graph that shows noise frequency components included in the output V3out.

As is clear from a comparison between FIGS. 5A and 6B, it can be understood that noise components of less than 150 Hz have been significantly removed. Further, as is clear from a comparison between FIGS. 5B and 7B, it can be understood that noise components of less than 300 Hz appearing in the input signal V3out have been significantly removed. This is attributed to the effects of the configuration having the capacitors C1, C2 and C3 inserted into the interstage portions of the multistage amplifier circuits.

Figure 8A:
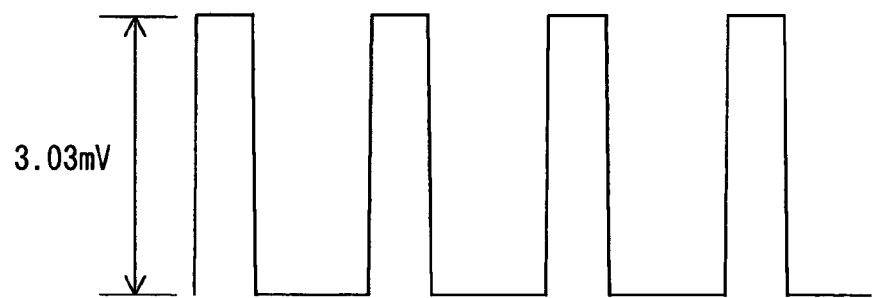
FIG. 8A is a graph showing input signals of the amplifier circuit 220 to indicate the S/N ratio in an intuitive manner in accordance with FIG. 6.
Figure 8B:
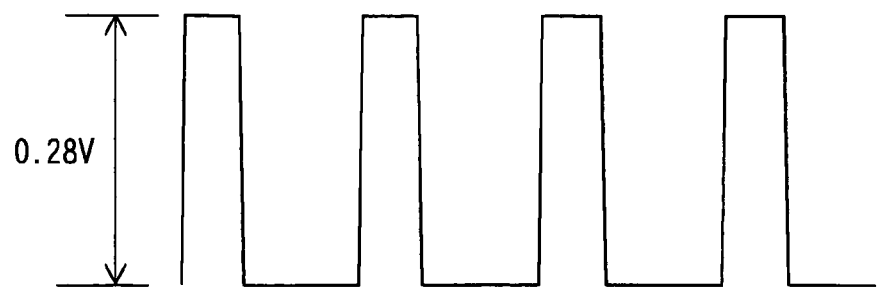
FIG. 8B is a graph showing the output signal V3out of the buffer 232 to indicate the S/N ratio in an intuitive manner in accordance with FIG. 7.

FIG. 8A shows a signal waveform represented in accordance with the input signal of FIG. 6B and the noise frequency components of FIG. 6B so that the S/N ratio in regard to the input signal (point b of FIG. 1) of the amplifier circuit 220 is indicated in an intuitive manner. FIG. 8B shows a signal waveform represented in accordance with the output signal of FIG. 7A and the noise frequency components of FIGS. 7B and 7C so that the S/N ratio in regard to the output signal (V3out) of the buffer 232 is intuitively indicated. From the simulation results, it can be understood that the S/N ratio with substantially no noise with respect to the level of the detection signal can be obtained in the respective interstage portion of the amplifier circuits.

Thus, according to the present invention, a DC offset occurring in the respective amplifier circuits can be removed using the effects of the respective inserted interstage capacitors (for example, C1, C2, C3). In addition, the S/N ratio of the device (activation signal output circuit) can be improved in accordance with the effects of the band pass filter being generated as the entire circuit. Further, since a compensation effect works for verifications in the characteristics of the respective elements constituting the circuit, the present invention is effective as well to improve the yield in massproduction of activation signal output circuits 200.

The detector/amplifier circuit 210, the amplifier circuit 220, the buffer 232 and the digitizer circuit 230 in the present embodiment corresponding to multiple stages of amplifier circuits as described in the claims. The respective amplifier circuit includes, for example, a level conversion, level comparison, and a level determination, which do not have amplifying operation.

OTHER EMBODIMENTS

The present invention is not limited to the embodiment described above, but may be practiced with other embodiments including modifications as described herebelow. Even with such the modifications and adaptations, advantages of the present invention can be obtained in accordance with the operation of the present invention.

From the viewpoint of sensitivity improvement, although the voltage doubler circuit is preferably used, the sensitivity, detection accuracy, and the like are improved according to the present invention even without the circuit. The amplifier circuit 220 may be a determination circuit that determines the high/low relationship in regard to the levels of the detection signal and the reference signal. Although the differential amplifier is preferably used in the detector/amplifier circuit 210 from the viewpoint of improvement in sensitivity and detection accuracy as well, the sensitivity and the detection accuracy are improved even without using the differential amplifier.

INDUSTRIAL APPLICABILITY

The technical field of the present invention is based on the existing radio laws of Japan and is therefore in conformance with the specifications of the laws. Accordingly, it is contemplated that there are other fields of adaptation depending on differences or changes in radio-related control laws associated with, for example, the nation, district, or time.

However, there are changes in that the present invention relates to the activation signal output circuit including the RF/DC converter circuit that inputs a radio frequency signal (RF) of a specific frequency, and outputs a DC potential (DC). Therefore, the present invention is usable for other arbitrary adaptations inasmuch as they conform to control laws under conditions of application thereof.

The invention claimed is:

1. An activation signal output circuit comprising:
   multiple stages of amplifier circuits in a plurality of stages, wherein a radio frequency signal intermittently transmitted is detected to thereby generate a detection signal, and an activation signal indicating that the radio frequency signal has been detected is output in accordance with the detection signal, wherein
   a capacitor C inserted in series in a signal transfer line in any one interstage portion of the amplifier circuits, whereby a high pass filter characteristic is provided; and
   a low pass filter characteristic is provided to the amplifier circuits by limiting a bias current flowing to transistors constituting the amplifier circuits to a minimized value, and a band pass filter characteristic is provided by using the low pass filter characteristic and a high pass filter characteristic provided with the capacitor.

2. An activation signal output circuit according to claim 1, wherein, of the amplifier circuits, an amplifier circuit in a foremost stage that detects and rectifies a radio frequency signal comprises:
   a detector diode that detect the radio frequency signal;
   a differential amplifier that includes differential pair transistors TrL and TrR; and
   a current mirror circuit that regulate a current of the differential amplifier,
   wherein a base current of TrL which is one of the differential pair transistors substantially matches with a direct current component of a current flowing in the detector diode, and a sum of currents flowing in the differential pair transistors TrL and TrR are regulated by the current mirror circuit to be substantially constant.

3. An activation signal output circuit according to claim 1, wherein, of the amplifier circuits, the amplifier circuit in the foremost stage that detects and rectifies the radio frequency signal further comprises a voltage-doubler detector circuit, and the detector diode for detecting the ratio frequency signal constitutes.

4. An activation signal output circuit comprising:
   multiple stages of amplifier circuits in a plurality of stages, wherein a radio frequency signal intermittently transmitted is detected to thereby generate a detection signal, and an activation signal indicating that the radio frequency signal has been detected is output in accordance with the detection signal, wherein
   a capacitor C inserted in series in a signal transfer line in any one interstage portion of the amplifier circuits, whereby a high pass filter characteristic is provided; and
   of the amplifier circuits, an amplifier circuit in a foremost stage that detects and rectifies a radio frequency signal comprises:
   a detector diode that detect the radio frequency signal;
   a differential amplifier that includes differential pair transistors TrL and TrR; and
   a current mirror circuit that regulate a current of the differential amplifier,
   wherein a base current of TrL which is one of the differential pair transistors substantially matches with a direct current component of a current flowing in the detector diode, and a sum of currents flowing in the differential pair transistors TrL and TrR are regulated by the current mirror circuit to be substantially constant.

5. An activation signal output circuit according to claim 4, wherein, of the amplifier circuits, the amplifier circuit in the foremost stage that detects and rectifies the radio frequency signal further comprises a voltage-doubler detector circuit, and the detector diode for detecting the ratio frequency signal constitutes.

6. An activation signal output circuit comprising:
multiple stages of amplifier circuits in a plurality of stages, wherein a radio frequency signal intermittently transmitted is detected to thereby generate a detection signal, and an activation signal indicating that the radio frequency signal has been detected is output in accordance with the detection signal, wherein
a capacitor C inserted in series in a signal transfer line in any one interstage portion of the amplifier circuits, whereby a high pass filter characteristic is provided; and
of the amplifier circuits, the amplifier circuit in the foremost stage that detects and rectifies the radio frequency signal further comprises a voltage-doubler detector circuit, and the detector diode for detecting the ratio frequency signal constitutes a part of the voltage-doubler detector circuit.

7. An activation signal output circuit comprising:
a first amplifier circuit including therein a detector circuit part that generates a detection signal by detecting a radio frequency signal transmitted intermittently, the first amplifier circuit generating a first signal by amplifying the detection signal of the detector circuit part;
a second amplifier circuit for generating a second signal by amplifying the first signal of the first amplifier circuit;
an output part for outputting an activation signal indicating detection of the radio signal in response to the second signal of the second amplifier circuit; and
a capacitor C provided in a signal transmission line in series between the first amplifier circuit and the second amplifier circuit thereby to provide a high pass filter characteristic.

8. An activation signal output circuit according to claim 7, wherein the detector circuit part includes a detector diode configured by a transistor.

9. An activation signal output circuit according to claim 7, wherein a cutoff frequency fc of the high pass filter characteristic is set lower than a frequency (F=1/T) corresponding to an intermittent incoming period T of the radio frequency signal intermittently transmitted.

10. An activation signal output circuit according to claim 9, wherein the capacitor C is set for a desired cutoff frequency fc to satisfy $$2\pi fc \cdot C \cdot |Z| \approx 1$$

with respect to an input impedance Z of the amplifier circuit of which an input side is connected with the capacitor C.

11. An activation signal output circuit according to claim 10, wherein a low pass filter characteristic is provided to the amplifier circuits by limiting a bias current flowing to transistors constituting the amplifier circuits to a minimized value, and a band pass filter characteristic is provided by using the low pass filter characteristic and a high pass filter characteristic provided with the capacitor.

12. An activation signal output circuit according to claim 10, wherein, of the amplifier circuits, an amplifier circuit in a foremost stage that detects and rectifies a radio frequency signal comprises:
a detector diode that detect the radio frequency signal;
a differential amplifier that includes differential pair transistors TrL and TrR; and
a current mirror circuit that regulate a current of the differential amplifier,
wherein a base current of TrL which is one of the differential pair transistors substantially matches with a direct current component of a current flowing in the detector diode, and a sum of currents flowing in the differential pair transistors TrL and TrR are regulated by the current mirror circuit to be substantially constant.

13. An activation signal output circuit according to claim 10, wherein, of the amplifier circuits, the amplifier circuit in the foremost stage that detects and rectifies the radio frequency signal further comprises a voltage-doubler detector circuit, and the detector diode for detecting the ratio frequency signal constitutes a part of the voltage-doubler detector circuit.

14. An activation signal output circuit according to claim 9, wherein a low pass filter characteristic is provided to the amplifier circuits by limiting a bias current flowing to transistors constituting the amplifier circuits to a minimized value, and a band pass filter characteristic is provided by using the low pass filter characteristic and a high pass filter characteristic provided with the capacitor.

15. An activation signal output circuit according to claim 9, wherein, the first amplifier circuit comprises:
a detector diode that detect the radio frequency signal;
a differential amplifier that includes differential pair transistors TrL and TrR; and
a current mirror circuit that regulate a current of the differential amplifier,
wherein a base current of TrL which is one of the differential pair transistors substantially matches with a direct current component of a current flowing in the detector diode, and a sum of currents flowing in the differential pair transistors TrL and TrR are regulated by the current mirror circuit to be substantially constant.

16. An activation signal output circuit according to claim 9, wherein, the first amplifier circuit comprises a voltage-doubler detector circuit, and the detector diode for detecting the ratio frequency signal constitutes a part of the voltage-doubler detector circuit.

* * * * *